(12) United States Patent
Chan et al.

(10) Patent No.: US 9,860,994 B2
(45) Date of Patent: Jan. 2, 2018

(54) CIRCUIT BOARD

(71) Applicant: UNIVERSAL GLOBAL TECHNOLOGY (SHANGHAI) CO., LTD., Shanghai (CN)

(72) Inventors: Wan-Chen Chan, Nantou County (TW); Chun-Chi Chiu, Nantou County (TW); Hsun-Fa Li, Nantou County (TW)

(73) Assignee: Universal Global Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/957,034

(22) Filed: Dec. 2, 2015

(65) Prior Publication Data

US 2017/0127530 A1    May 4, 2017

(30) Foreign Application Priority Data

Oct. 30, 2015    (CN) .......................... 2015 1 0726246

(51) Int. Cl.
*H05K 1/11* (2006.01)
*H05K 3/34* (2006.01)

(52) U.S. Cl.
CPC ............ *H05K 3/3452* (2013.01); *H05K 1/111* (2013.01)

(58) Field of Classification Search
CPC ........ H05K 1/11; H05K 3/3452; H05K 3/361; H05K 3/363; H05K 3/4084; H05K 2201/09372; H05K 2201/09381; H05K 2201/0939; H05K 2201/094; H05K 2201/0191; H05K 2201/09409; H05K 2201/09418; H05K 2201/09427; H05K 2201/09436; H05K 2201/0949; H05K 2201/0989; H05K 2201/09727; H05K 2201/099; H05K 2203/0588; H01L 23/3107; H01L 23/4985; H01L 23/49572; H01L 23/49838; H01L 23/49861; H01L 24/86; H01L 2924/014; H01L 2924/01005;

(Continued)

(56) References Cited

U.S. PATENT DOCUMENTS

2003/0070292 A1* 4/2003 Tatoh ...................... H01L 23/15
                                                                  29/846
2004/0238922 A1* 12/2004 DiStefano ........... H01L 23/3107
                                                                  257/668

(Continued)

*Primary Examiner* — Timothy Thompson
*Assistant Examiner* — Guillermo Egoavil
(74) *Attorney, Agent, or Firm* — Muncy, Geissler, Olds & Lowe, P.C.

(57) ABSTRACT

A circuit board having a substrate, a first metal layer, a second metal layer and a solder mask layer. The first metal layer and the second metal layer with unequal surface areas spacedly arranged on the substrate and respectively providing a first solderable region and a second solderable region with equal surface areas. The solder mask layer having an opening and covered on the substrate, the first metal layer and the second metal layer to expose the first solderable region and the second solderable region. Besides, the first metal layer further provides a window abutted to the first solderable region, and the opening exposes a first blank region and a second blank region. Thus, the problem of unequal solder regions due to offset of the solder mask layer can be avoided, and improving the yield rate of the fabrication process.

9 Claims, 3 Drawing Sheets

(58) Field of Classification Search
CPC . H01L 2924/01006; H01L 2924/01013; H01L 2924/01023; H01L 2924/01027; H01L 2924/01029; H01L 2924/01033; H01L 2924/01038; H01L 2924/12042; H01L 2924/01047; H01L 2924/01074; H01L 2924/01078; H01L 2924/01079; H01L 2924/01082; H01R 12/57; H01R 12/62; H01R 43/0256; H01R 43/0263
USPC .................. 174/261, 254; 257/668, E21.516, 257/E23.055, E23.124; 439/494
See application file for complete search history.

(56) References Cited

U.S. PATENT DOCUMENTS

| | | | | |
|---|---|---|---|---|
| 2005/0098884 A1* | 5/2005 | Cheng | ............... | H01L 23/49541 257/737 |
| 2007/0178750 A1* | 8/2007 | Chung | ................... | H01R 12/57 439/495 |
| 2014/0319652 A1* | 10/2014 | Lee | ..................... | H01L 23/5227 257/531 |

* cited by examiner

… …

CIRCUIT BOARD

BACKGROUND OF THE INVENTION

1. Field of the Invention

The present invention relates to printed circuit board technology, and more particularly, to the layout design of a circuit board that eliminates the problem of unequal solder regions due to offset of the solder mask layer during the fabrication process.

2. Description of the Related Art

Small size electronic components (such as 0201 or 01005 chip components) are more sensitive to the solder pad size of a circuit board. If there is a significant surface area difference between the solder pads on the circuit board corresponding to the bonding ends of electronic components, the problem of solder open or tombstone may occur during the manufacturing process to bond the electronic components to the circuit board, therefore affecting the overall process yield FIG. 1 illustrates the layout of a traditional circuit board 70. As illustrated, the circuit board 70 comprises a substrate 71, a first metal layer 72 and a second metal layer 73 spacedly arranged on the substrate 71, and a solder mask layer 74 covered on the surface of the substrate 71. The solder mask layer 74 covers a part of the substrate 71, a part of the first metal layer 72 and a part of the second metal layer 73, and thus, defining a first solderable region 721 and a first masking region 722 on the first metal layer 72, a second solderable region 731 and a second masking region 732 on the second metal layer 73, and a blank region 711 on the substrate 71 between the first metal layer 72 and the second metal layer 73. The first solderable region 721 and the second solderable region 731 are equal in shape and surface area.

During the fabrication of the aforesaid traditional circuit board 70, an offset of the solder mask layer 74 may occur. For example, the solder mask layer 74 may be offset to the right, as illustrated in FIG. 2, the solder mask layer 74 at the first masking region 722 is offset to the right, reducing the surface area of the first solderable region 721. On the other hand, the solder mask layer 74 at the second masking region 732 is also offset to the right, increasing the surface area of the second solderable region 731, resulting in surface area inequality between the first solderable region 721 and the second solderable region 731, and thus, bad soldering quality may occur during soldering of the electronic component.

CN104270887A discloses a BAG circuit board. As illustrated in FIG. 1 of the abovesaid patent, the BAG substrate includes arranged thereon two solder pads of equal area. However, if the solder pads are unequal in surface area, the aforesaid patent does not provide any technical measure to maintain equality of the bonding areas between the solder pads and the electronic component, and thus, the aforesaid bad soldering quality may occur.

SUMMARY OF THE INVENTION

The present invention has been accomplished under the circumstances in view. It is an objective of the present invention to provide an innovative circuit board structure, which solves the solder mask layer offset problem, maintaining surface areas of the solderable regions equal, therefore reducing the risk of bad soldering between small size electronic components and the circuit board.

To achieve the objective of the present invention, a circuit board is provided to comprise a substrate, a first metal layer, a second metal layer and a solder mask layer. The first metal layer and the second metal layer are spacedly arranged on the substrate. The surface area of the first metal layer is larger than the surface area of the second metal layer. Further, the first metal layer provides a first solderable region at one lateral side thereof near the second metal layer. The second metal layer provides a second solderable region at one lateral side thereof near the first metal layer. The first solderable region and the second solderable region are equal in surface area.

The solder mask layer is partially covered on the substrate, the first metal layer and the second metal layer. Further, the solder mask layer provides an opening to expose the first solderable region and the second solderable region.

Further, the first metal layer defines therein a window that is abutted to the first solderable region. Further, the opening exposes a first blank region and a second blank region of the substrate. The first blank region corresponds to the window. The second blank region is abutted to one lateral side of the second solderable region that is opposite to and remote from the first solderable region.

By means of the arrangement of the window on the first metal layer, the regions of the substrate at two opposite lateral sides relative to the first solderable region and the second solderable region are exposed by the window. Thus, even if either the surface area of the first blank region or the second blank region is reduced due to an offset of the solder mask layer during the fabrication process, the surface area of the first solderable region and the surface area of the second solderable region can still be maintained equal, reducing the risk of bad soldering between small size electronic components and the circuit board, and thus, improving the overall yield.

Other and further benefits, advantages and features of the present invention will be understood by reference to the following specification in conjunction with the accompanying drawings, in which like reference characters denote like elements of structure.

ETAILED DESCRIPTION OF THE INVENTION

Figure 1:
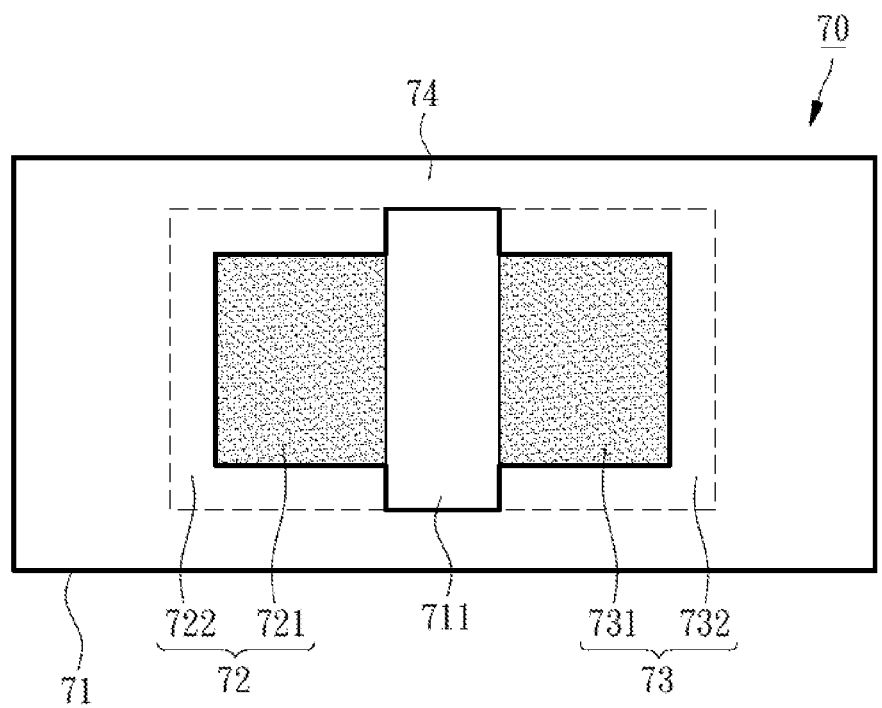
FIG. 1 is a schematic drawing illustrating a conventional structure of a circuit board.
Figure 2:
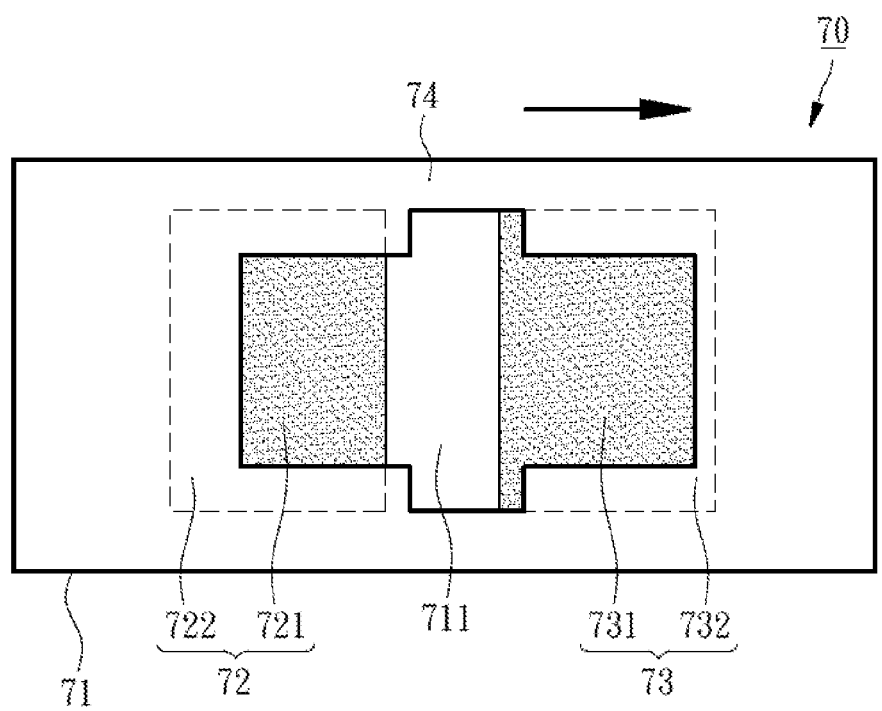
FIG. 2 is another schematic drawing of the conventional circuit board, illustrating an offset of the solder mask layer.
Figure 3:
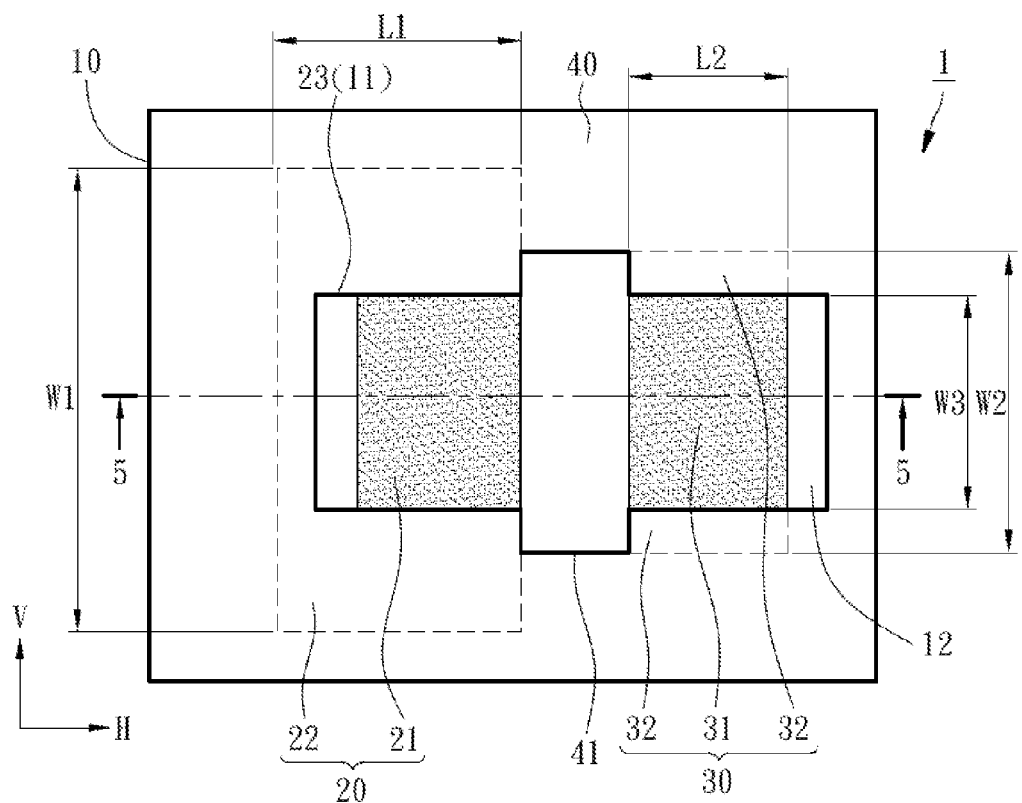
FIG. 3 is a schematic drawing of a circuit board in accordance with an exemplary embodiment of invention.
Figure 4:
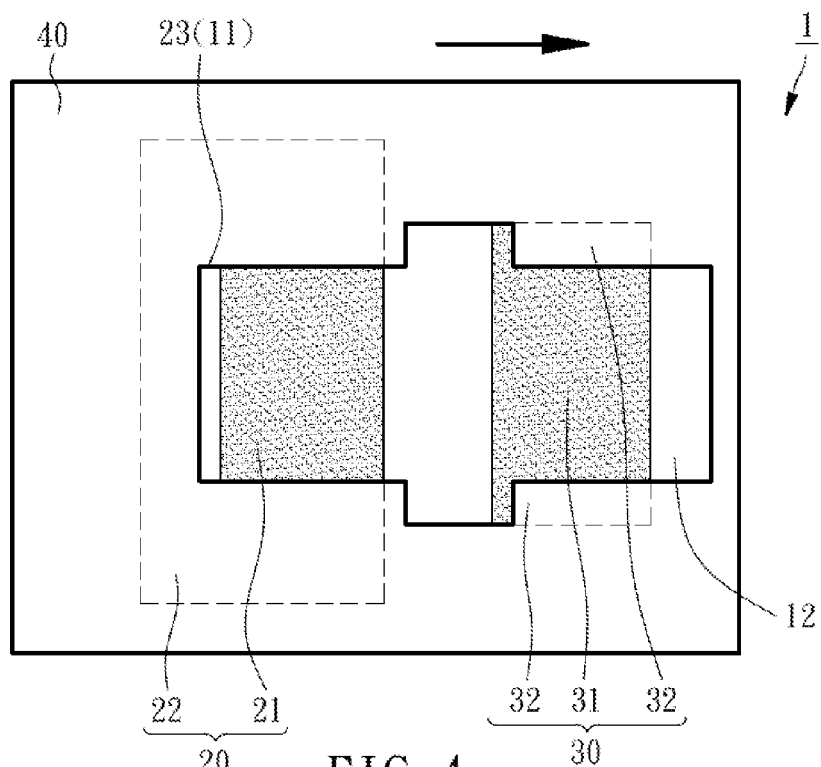
FIG. 4 is another schematic drawing of the circuit board in accordance with the exemplary embodiment of the invention, illustrating an offset of the solder mask layer.
Figure 5:
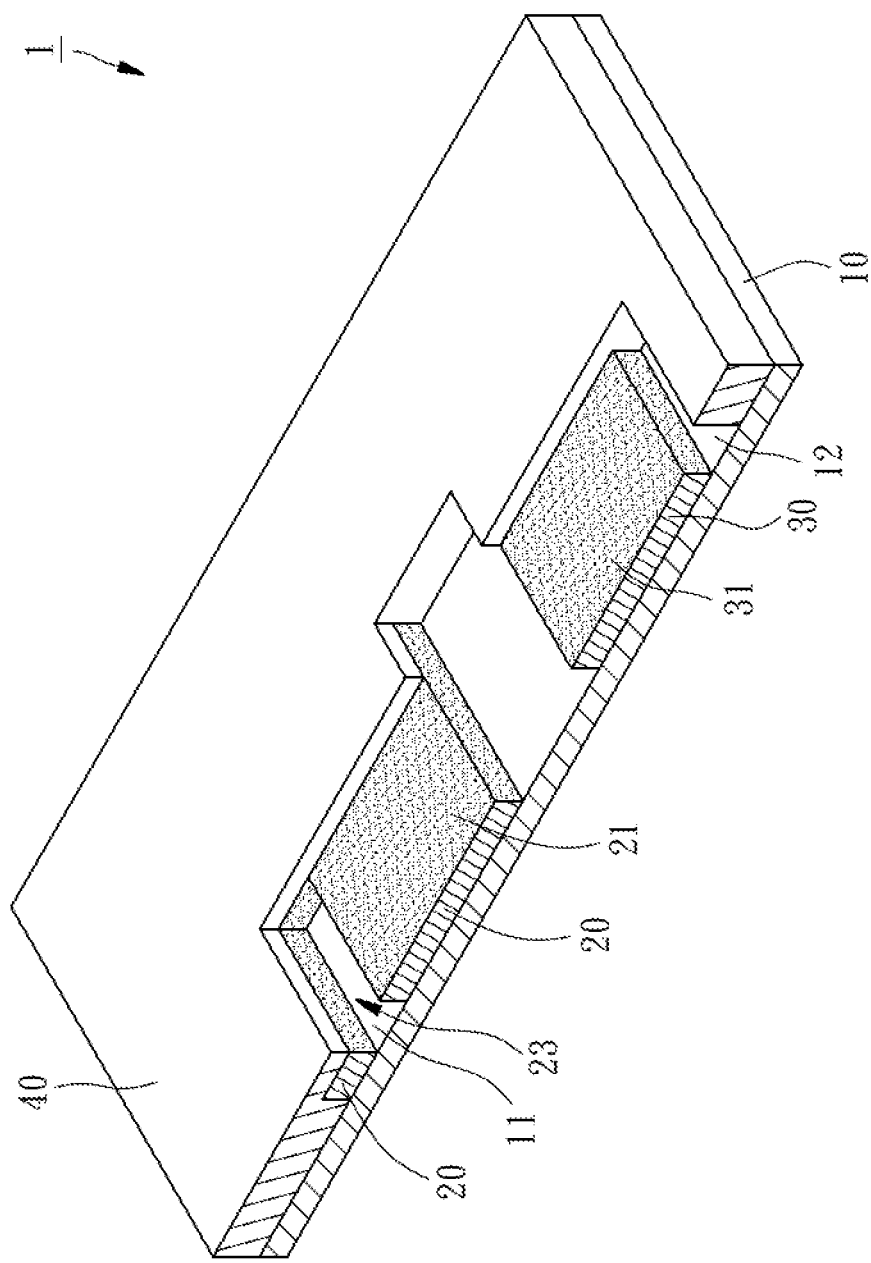
FIG. 5 is a perspective cross-sectional view taken along line 5-5 of FIG. 3.

An exemplary embodiment with accompanying drawings in accordance with the present invention is disclosed. Referring to FIGS. 3-5, to facilitate explanation of the exemplary embodiment, the first metal layer 20 and the second metal layer 30 are designated to be spacedly arranged in a horizontal direction H. However, in actual application, the first metal layer 20 and the second metal layer 30 may be spacedly arranged in a different direction, and therefore, the present exemplary embodiment should not be taken as limiting. In this exemplary embodiment, the circuit board 1 mainly comprises a substrate 10, a first metal layer 20, a second metal layer 30 and a solder mask layer 40. The structures of the aforesaid elements of the circuit board 1 and their relative relationships are described hereinafter.

Referring first to FIG. 3, the first metal layer 20 and the second metal layer 30 are spacedly arranged on the substrate 10 along the horizontal direction H. Both the first metal layer 20 and the second metal layer 30 have a rectangular shape. A length L1 of the first metal layer 20 is larger than a length L2 of the second metal layer 30 in the horizontal direction H. A width W1 of the first metal layer 20 is larger than a width W2 of the second metal layer 30 in a vertical direction V so that the surface area of the first metal layer 20 is larger than the surface area of the second metal layer 30. Further, the first metal layer 20 comprises a first solderable region 21 and a window 23 which abuts to the first solderable region 21 and has a rectangular shape. The window 23 is located inside the first metal layer 20 and configured to expose the substrate 10. The second metal layer 30 comprises a second solderable region 31. The length of the second solderable region 31 is equal to the length L2 of the second metal layer 30. Further, the first solderable region 21 and the second solderable region 31 have the same shape and the same surface area.

As illustrated in FIG. 3 and FIG. 5, the solder mask layer 40 is partially covered on the substrate 10, the first metal layer 20 and the second metal layer 30. Further, the solder mask layer 40 defines therein a crossed opening 41 (see the bold line in FIG. 3). The covering range of the solder mask layer 40 is beyond the area of the opening 41 so that the first solderable region 21, the second solderable region 31, a first blank region 11 of the substrate 10 that corresponds to the window 23, and a second blank region 12 of the substrate 10 that is abutted to an outer lateral side of the second solderable region 31 are exposed to the outside through the opening 41, i.e., the second blank region 12 is abutted to the lateral side of the second solderable region 31 that is disposed opposite to and remote from the first solderable region 21 and the first blank region 11, the first solderable region 21, the second solderable region 31 and the second blank region 12 are aligned in straight-line in the horizontal direction H.

Further, the opening 41 of the solder mask layer 40 defines a C-shaped first masking region 22, which is on the first metal layer 20 and in abutment to the first solderable region 21, and defines two parallel arranged second masking regions 32 on the second metal layer 30 (i.e., the width W3 of the opening 41 is smaller than the width W2 of the second metal layer 30).

Please then refer to FIG. 4. Subject to the design of the window 23, if the solder mask layer 40 is offset to the right during the fabrication process of the circuit board 1, the arrangement of the window 23 will cause the surface area of the first blank region 11 to be reduced without affecting the surface area of the first solderable region 21, and an increase of the second blank region 12 in surface area will not affect the surface area of the second solderable region 31. Thus, the surface area of the first solderable region 21 and the surface area of the second solderable region 31 can be maintained equal. By means of the first blank region 11 and the second blank region 22, the design of the circuit board 1 prevents any surface area change of the first solderable region 21 and the second solderable region 22 due to a left or right offset of the solder mask layer 40, reducing the risk of bad soldering between small size electronic components and the first solderable region 21, or small size electronic components and second solderable region 31, and thus, improving the overall yield.

It is to be noted that the shape of the opening 41 can be changed to a rectangle or a variety of other shapes; the crossed shape in this exemplary embodiment is not a limitation.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A circuit board, comprising:
   a substrate;
   a first metal layer and a second metal layer arranged on said substrate and spaced from each other, the surface area of said first metal layer being larger than the surface area of said second metal layer, said first metal layer comprising a first solderable region located at one lateral side thereof near said second metal layer, said second metal layer comprising a second solderable region located at one lateral side thereof near said first solderable region, said first solderable region and said second solderable region being substantially equal in surface area; and
   a solder mask layer covered on said substrate, said first metal layer and said second metal layer, said solder mask layer comprising an opening configured to expose said first solderable region and said second solderable region;
   wherein said first metal layer defines therein a window in abutment to said first solderable region; said opening exposes a first blank region and a second blank region of the substrate; said first blank region is disposed corresponding to said window, and said second blank region is abutted to one lateral side of said second solderable region opposite to and remote from said first solderable region;
   wherein the window is located inside the first metal layer;
   wherein said opening defines a first masking region on said first metal layer, and said first masking region has a C-shaped shape and said first masking region is abutted to said first solderable region.

2. The circuit board as claimed in claim 1, wherein said first blank region, said first solderable region, said second solderable region and said second blank region are arranged along a straight-line direction.

3. The circuit board as claimed in claim 1, wherein said opening has a rectangular or crossed shape.

4. The circuit board as claimed in claim 2, wherein the length of said first metal layer in said straight-line direction is larger than the length of said second metal layer in said straight-line direction.

5. The circuit board as claimed in claim 1, wherein the width of said first metal layer in said straight-line direction is larger than the width of said second metal layer in said straight-line direction.

6. The circuit board as claimed in claim 1, wherein said opening defines two second masking regions on said second metal layer in a parallel arrangement.

7. The circuit board as claimed in claim 2, wherein said opening has a rectangular or crossed shape.

8. The circuit board as claimed in claim 2, wherein said opening defines two second masking regions on said second metal layer in a parallel arrangement.

9. The circuit board as claimed in claim 2, wherein the width of said first metal layer in said straight-line direction is larger than the width of said second metal layer in said straight-line direction.

* * * * *